United States Patent
Introwicz

(10) Patent No.: US 10,302,678 B2
(45) Date of Patent: May 28, 2019

(54) MOTOR CONTROL CIRCUITRY

(75) Inventor: Ernest Henry Introwicz, Madely (GB)

(73) Assignee: TRW limited, Solihull, West Midlands (GB)

( * ) Notice: Subject to any disclaimer, the term of this patent is extended or adjusted under 35 U.S.C. 154(b) by 831 days.

(21) Appl. No.: 13/512,418

(22) PCT Filed: Nov. 25, 2010

(86) PCT No.: PCT/GB2010/051969
§ 371 (c)(1),
(2), (4) Date: Jun. 19, 2012

(87) PCT Pub. No.: WO2011/064589
PCT Pub. Date: Jun. 3, 2011

(65) Prior Publication Data
US 2013/0134963 A1    May 30, 2013

(30) Foreign Application Priority Data
Nov. 27, 2009    (GB) .................................. 0920794.5

(51) Int. Cl.
  G01R 19/00    (2006.01)
  G01R 1/30     (2006.01)
  H02P 6/08     (2016.01)

(52) U.S. Cl.
  CPC .............. G01R 1/30 (2013.01); H02P 6/085 (2013.01)

(58) Field of Classification Search
  CPC ...... G01R 19/00; G01R 19/145; G01R 19/15; G01R 19/165; G01R 1/30; H02P 6/085; H02P 1/34
(Continued)

(56) References Cited

U.S. PATENT DOCUMENTS 4,972,320 A * 11/1990 Sugiura ................ B62D 5/0463
                                                    180/446
6,316,967 B1   11/2001 Takagi et al.
(Continued)

FOREIGN PATENT DOCUMENTS

EP    1096262 A2    2/2001
JP    2005210871 A   8/2005
(Continued)

OTHER PUBLICATIONS

International Search Report for PCT/GB2010/051969 dated Mar. 10, 2011.

*Primary Examiner* — Son T Le
(74) *Attorney, Agent, or Firm* — MacMillan, Sobanski & Todd, LLC

(57) ABSTRACT

A motor current measurement circuit (7) includes a sense resistor (8) located in a path through which, in use of the motor (1), at least a part of the current flowing into or out of the motor flows, a first amplifier which comprises a differential amplifier (9) which has a first input and second input which are respectively connected to the opposing ends of the sense resistor and has an output at which the amplifier (9) is arranged to produce, in use, an output signal representative of a voltage dropped across the resistor (8) and hence the current flowing through the resistor (8), and an analogue to digital converter (12) having an input which is connected to the output of the first amplifier (9) and an output. The converter (12) is arranged to provide at its output a digital signal representing the current flowing through the sense resistor (8), and the first amplifier (9) comprises a transconductance amplifier whereby the output signal comprises a current which is proportional to the input voltage across the two inputs.

9 Claims, 1 Drawing Sheet

(58) Field of Classification Search
USPC ............ 324/123, 522, 713, 177, 120, 117 R, 324/117 H, 76.82
See application file for complete search history.

(56) References Cited

U.S. PATENT DOCUMENTS

| | | |
|---|---|---|
| 7,015,664 B2 | 3/2006 | Coles et al. |
| 7,327,103 B1 | 2/2008 | El-Sadi |
| 2005/0269982 A1* | 12/2005 | Coles ................ H02P 6/185 318/400.05 |
| 2007/0170878 A1* | 7/2007 | Schillaci ............ H02P 25/034 318/400.04 |
| 2007/0268028 A1* | 11/2007 | Moyer .................. H02H 3/05 324/713 |
| 2008/0112817 A1* | 5/2008 | Sylvester ................. 417/44.11 |

FOREIGN PATENT DOCUMENTS

| | | |
|---|---|---|
| JP | 2008086103 A | 4/2008 |
| WO | 2005074115 A1 | 8/2005 |
| WO | 2008139178 A1 | 11/2008 |

* cited by examiner

MOTOR CONTROL CIRCUITRY

CROSS-REFERENCE TO RELATED APPLICATIONS

This application is the National Phase of International Application PCT/GB2010/051969 filed 25 Nov. 2010 which designated the U.S. That International Application was published in English under PCT Article 21(2) on 3 Jun. 2011 as International Publication Number WO 2011/064589 A1. PCT/GB2010/051969 claims priority to U.K. Application No. 0920794.5, filed 27 Nov. 2009. Thus, the subject non-provisional application also claims priority to U.K. Application No. 0920794.5, filed 27 Nov. 2009. The disclosures of both applications are incorporated herein by reference.

BACKGROUND OF THE INVENTION

This invention relates to improvements in motor current measurement circuitry, in particular but not exclusively for use as part of a motor control circuit suitable for the control of a motor that forms part of an electric power assisted steering (EPAS) system.

It is known to provide a current measurement circuit for measuring the current flowing into and out of the ground return path, or DC link, of a multi-phase motor of an EPAS system. This can be used as part of the control circuit for a low speed sensorless motor, by which we mean a motor in which no dedicated position sensor is provided and instead a measure of current is used to estimate the motor position. By knowing the impedance of the motor when the rotor is at different positions it is possible to determine its position from the current measurement and how the current measurement changes over time. But this requires a highly accurate measurement if precise control is needed, which has proven especially problematic in the demanding environment in which EPAS systems are located, subject to high levels of EM noise in an often limited space.

Of course, current sensing circuits find application in a wide range of other circuits, and the present invention has application in other circuits where a high precision current measurement is required.

Typically, in prior art current measurement circuits for use in automotive applications the current measurement signal is derived from amplifying the potential difference, or voltage drop, across a resistor placed in series in the current path. With a motor, this typically requires the resistor to be placed in series with two phases of the motor or the DC link. This signal is amplified as required to a level suitable for direct input to an analogue to digital converter (ADC) where it is converted into a digital representation using an analogue to digital converter. The current measurement signal in the prior art is obtained using a differential amplifier whose output comprises a voltage proportional to the voltage dropped across the resistor. An example of such a circuit is known from WO2004/023639.

SUMMARY OF THE INVENTION

According to a first aspect, the invention provides a motor current measurement circuit which includes a sense resistor located in a path through which, in use of the motor, at least a part of the current flowing into or out of the motor flows, a first amplifier which comprises a differential amplifier which has a first input and second input which are respectively connected to the opposing ends of the sense resistor and has an output at which the amplifier is arranged to produce, in use, an output signal representative of a voltage dropped across the resistor and hence the current flowing through the resistor, and an analogue to digital converter (ADC) having an input which is connected to the output of the first amplifier and an output, in use the converter being arranged to provide at its output a digital signal representing the current flowing through the sense resistor, and in which the first amplifier comprises a transconductance amplifier whereby the output signal comprises a current which is proportional to the input voltage across the two inputs.

The applicant has appreciated that a potential problem with the prior art arrangement is that the accuracy of the measurement can be too low to be used to give a measurement of current accurate enough for use in low speed sensorless motor control. The previous solution has been to use a dedicated position sensor for systems where accurate position measurement is needed at low speeds. The applicant has now appreciated that a principal cause of this often low accuracy is induced currents in the ground plane, nominally from stray magnetic fields generated by the motor drive circuit or the motor itself cause a potential difference between the differential amplifier and any subsequent processing, such as subsequent amplifiers or the ADC.

The applicant has realised that by providing a differential (sometimes referred to as an operational) transconductance amplifier in a circuit as defined by the present invention, to provide an output signal whose current is proportional to the differential voltage at the inputs rather than whose voltage is proportional as has been provided in the past, the circuit is less sensitive to voltage noise present in the ground plane within the circuit itself. It is possible to make a circuit in this way which is less sensitive to noise pickup in the link from the output of the amplifier to any subsequent circuitry, such as an ADC. The applicant has appreciated that this can provide a significant advantage making the circuit suitable for use in determining motor position even at relatively low speeds.

The first amplifier may produce an output signal whose current is related to the input voltages by the following function:

$$I_{out} = G^*(V_{in1} - V_{in2})$$

where $I_{out}$ is the current produced at the output of the first amplifier, $V_{in1}$ and $V_{in2}$ are the voltages applied to the two inputs, and G is the gain of the amplifier.

The gain may be chosen such that the amplifier provide a conversion ratio of 0.1 Amperes per volt. This means that if the input voltage is 1 volt the output will be 0.1 Amps, 2 volts would become 0.2 Amps and so on.

A further resistor may be provided between the input of the ADC and the ground, the resistor causing the current output from the first amplifier to produce a proportional voltage at the input to the ADC. In effect this converts the current signal into a voltage signal. This resistor should preferably be connected to the input of the ADC as close as possible to the input.

The resistor may be chosen to be between 100 Ohms and 500 Ohms, most preferably 200 Ohms. Combined with a 0.1 Amperes per volt gain of the first amplifier this provides a total transfer function of 20 volts per volt overall from the shunt voltage to the ADC input. This mimics prior art circuits using differential voltage amplifiers with that gain. The skilled person will, of course, understand that other gains can be provided as required but it has been found that this function works well in automotive applications.

The output of the first amplifier may be fed directly to the input of the analogue to digital converter, or it may be fed though a further amplifier. As described for the ADC, a further resistor may be provided between the input of the further amplifier and ground, preferably connected as close to the input as possible.

The current sensing circuit may be formed as an integrated circuit. A further advantage of the use of such a transconductance amplifier is that it uses far less resistors in its construction compared with a prior art differential amplifier in the circuit. In fact, it is possible to construct such an amplifier with no internal resistors in its construction apart from for the input stage. The invention may provide an amplifier which only has resistors in its input stage.

The circuit may be constructed consisting of only six resistors. This is useful in the fabrication of the circuit as an application specific integrated circuit (commonly referred to as an ASIC), where it can be difficult to precisely control the value of resistors. In one arrangement all of the resistors around the input may be of the same, matched values. For example, each input may have a gain set by two resistors which can be of the same value. This has advantages compared with the need to provide pairs of unmatched resistors around the amplifier of a prior art circuit. Closely matched resistors can often be obtained in packs at low cost, making such a circuit simpler and lower cost.

The sense resistor may be located so that substantially all of the current drawn from the DC supply flowing through the phase of the motor flows through the resistor. This can be achieved by locating the resistor in the motor ground return path of the motor. It may comprise a single resistor element, or a group of multiple elements arranged in series or in parallel between a first and second point. The voltage drop may be measured across the whole group of elements at the first and second points.

According to a second aspect the invention provides an integrated circuit, such as an ASIC, including a current sensing circuit according to the first aspect of the invention.

The applicant is not aware of any prior art integrated circuit solution to current measurement which includes an operational transconductance amplifier internal to the circuit design to reduce problems of unwanted electrical noise.

The circuit may be suitable for use in automotive applications, in which power is supplied from a battery source of 12 volts, or perhaps 24 volts or 48 volts.

According to a third aspect the invention provides, in a motor control circuit for a sensorless motor in an electric power assisted steering system, a current sensing circuit according to the first aspect of the invention and/or an ASIC according to second aspect of the invention.

The motor control circuit may be located in a common housing with high power drive circuitry for the motor, in particular a sensorless motor that forms a part of an EPAS system. Some or all of this high power circuitry may be provided on the same integrated circuit as the current measurement circuit. In the past this would not have been possible, or would have required very careful consideration of grounding. In any event, the current measurement in the past in such arrangements would often have been noisy and not suitable for providing the high accuracy measurements demanded in sensorless control.

BRIEF DESCRIPTION OF THE DRAWINGS

There will now be described by way of example only one embodiment of the present invention with reference to the accompanying drawings of which.

DETAILED DESCRIPTION OF THE PREFERRED EMBODIMENT

Figure 1:
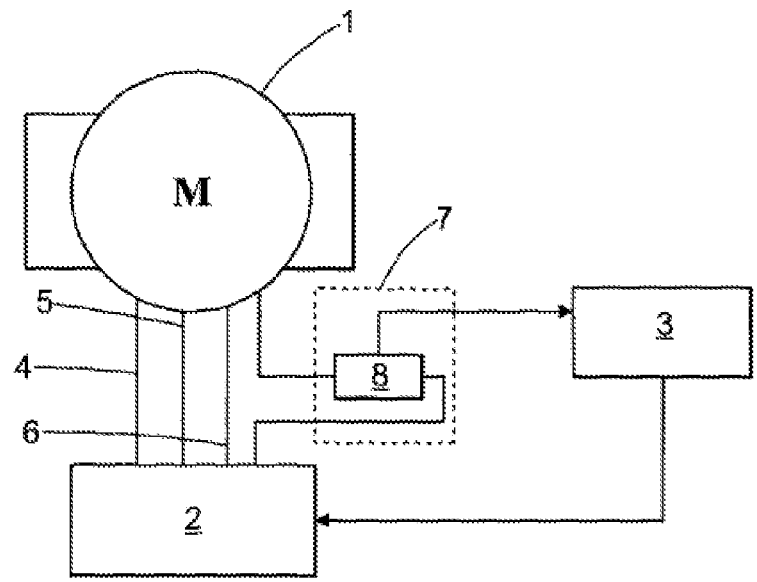
FIG. 1 is an overview of a motor circuit suitable for use in an electric power assisted steering system.
Figure 2:
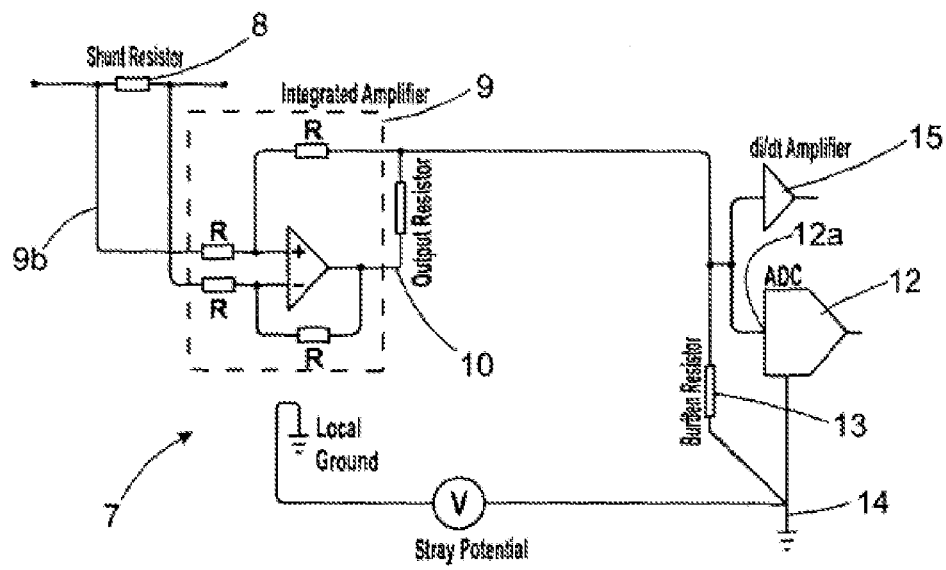
FIG. 2 is a schematic of an embodiment of a motor current measurement circuit in accordance with a first aspect of the invention that forms part of the system of FIG. 1.

A motor circuit suitable for use in an electric power assisted steering system is shown in FIG. 1. A motor 1 is typically connected to a part of a steering mechanism through a gearbox so as to provide assistance torque for the driver in a known manner. The motor 1 shown is a three phase motor and is driven by currents supplied from a motor drive circuit 2 which is controlled by a control circuit 3. The three phases 4,5,6 each comprise a top and bottom switches (not shown) connected in each phase, or arm, of the motor, in a bridge. The motor drive circuit 2 controls the configuration of the switches, which in turn alternately connect the phases of the motor 1 to either a positive battery terminal or to an earth, a control strategy known as pulse width modulation. The control circuit 3 controls the motor drive circuit 2 using a suitable control algorithm. Many different algorithms are known in the art, often based on pulse width modulation as the means of controlling the speed and torque of the motor.

The motor drive circuit 2 in the example requires, in order to apply the algorithm, information indicating the position of the rotor of the motor 1 at any given time. This can be provided from a dedicated motor position sensor. Alternatively, information about the position of the motor 1 can be derived from measurements of the current flowing into and out of the ground return path of the motor 1 at any time using a current measurement circuit. In this example, the latter is chosen, with the current measuring circuit 7 providing current signals to the control circuit 3. The current measurement can then be used to determine the rate of change of current with time, and from this the motor position, provided information about motor inductance is known over a range of motor positions. This kind of system is known from, among other teachings, WO2004/023639. An exemplary current measurement circuit is shown in FIG. 1 of the drawings.

The circuit 7 comprises a current sense resistor 8, or shunt, which is placed in the common ground return path of the motor 1. As current flows through the motor 1, it flows through the sense resistor 8 which, in turn, causes a voltage drop to develop across the sense resistor 8 which is defined by Ohms law as:

$$V_{drop} = I * R$$

where $V_{drop}$ is the voltage dropped across the sense resistor 8, I is the current flowing through the sense resistor 8, and R is the resistance of the sense resistor 8. The sense resistor 8 is assumed to be a pure resistance, although in practice it may have some significant inductance or capacitance associated with it. Nevertheless, if the resistance dominates, the voltage dropped will generally be as expected from Ohms law.

A connection is made from each end of the sense resistor to a respective input 9a, 9b of a first amplifier 9. This amplifier 9 comprises an operational, or differential, transconductance, amplifier. It has four input resistors that set the gain of the two inputs, all of which in the example are of the same value. The amplifier performs the function of providing at an output 10 a current signal whose value is proportional to the voltage difference between its inputs, which in the arrangement of FIG. 1 means the current output will be proportional to the current flowing through the sense resistor. If the amplifier is an ideal amplifier, the first amplifier may perform the following function:

$$I_{out}=G*(V_{in}1-V_{in}2)$$

where $I_{out}$ is the current produced at the output of the first amplifier, $V_{in1}$ and $V_{in2}$ are the voltages applied to the two inputs, and G is the gain of the amplifier. The gain is chosen so that 1 volt across the inputs provides 0.1 Amps at the output. 0.1 Amps at the output.

The signal at the output 10 of the first amplifier 9 is connected through a further connection 11, typically a track on a printed circuit board, to an analogue to digital converter (ADC) 12. The ADC 12 should be chosen with a high input impedance, and between an input 12a and ground 14 a burden resistor 13 is provided. In the example this has a value of 200 Ohms, and its presence convert the current output from the first amplifier into a voltage. This gives an overall function, from input to the first amplifier to the input of the ADC of 20 volts per volt. The converter has a single output and provides at this output a digital representation of the voltage present at the input of the ADC. A wide variety of ADC circuits can be used, and the precise choice of ADC is not critical to the implementation of this invention and so will not be described in detail here.

In the embodiment shown, the output of the first amplifier 9 is also fed to the input of a second amplifier 15. This is an amplifier which provides a gain to the voltage at its input proportional to the rate of change of voltage to provide a voltage at its output. The input impedance of the second amplifier is chosen to be very high, and again a resistor is provided between the input and a ground potential which serves to convert the current flowing to the input into a voltage. As shown, this resistor is the same resistor 13 connected to the input of the ADC 12.

What is claimed is:

1. An electric power assisted steering system comprising:
   a steering mechanism;
   a motor that selectively provides a steering assistance torque to the steering mechanism;
   a motor drive circuit that supplies electrical current through a path to operate the motor;
   a control circuit that operates the motor drive circuit; and
   a motor current measurement circuit that provides an electrical current signal to the control circuit, the motor current measurement circuit including:
      a sense resistor located in a path through which, in use of the motor, at least a part of a current flowing into or out of the motor flows,
      an amplifier means which has a first input and a second input which are respectively connected to opposing ends of the sense resistor and has an output at which the amplifier means is arranged to produce, in use, an output signal representative of a voltage dropped across the sense resistor and, hence, the current flowing through the sense resistor, and
      an analogue to digital converter having an input which is connected to the output of the amplifier means and an output that is provided to the control circuit, wherein in use the analogue to digital converter is arranged to provide at its output a digital signal representing the current flowing through the sense resistor, and in which
      the amplifier means comprises a transconductance amplifier whereby the output signal comprises a current which is proportional to the input voltage across the first and second inputs, and further in which
      the transconductance amplifier comprises a part of an integrated circuit, and
      wherein the integrated circuit also includes the analogue to digital converter.

2. The motor current measurement circuit according to claim 1 wherein the integrated circuit comprises an application specific integrated circuit (ASIC).

3. The motor current measurement circuit according to claim 1 in which a further resistor is provided between the input of the analogue to digital converter and ground, the further resistor causing the current output from the first amplifier to produce a proportional voltage at the input to the analogue to digital converter.

4. An electric power assisted steering system comprising:
   a steering mechanism;
   a motor that selectively provides a steering assistance torque to the steering mechanism;
   a motor drive circuit that supplies electrical current through a path to operate the motor;
   a control circuit that operates the motor drive circuit; and
   a motor current measurement circuit that provides an electrical current signal to the control circuit, the motor current measurement circuit including:
   (1) a sense resistor located in the path through which the motor drive circuit supplies electrical current to operate the motor,
   (2) an amplifier means having first and second inputs respectively connected to opposing ends of the sense resistor and an output that provides an output signal in the form of an electrical current that is representative of a voltage dropped across the sense resistor and, hence, an amount of electrical current flowing through the sense resistor, wherein the amplifier means comprises a part of an integrated circuit, and
   (3) an analogue to digital converter having an input that is connected to the output of the amplifier means and an output that provides a digital signal to the control circuit that is representative of the amount of electrical current flowing through the sense resistor.

5. An electric power assisted steering system according to claim 4 wherein the integrated circuit includes the analogue to digital converter.

6. An electric power assisted steering system according to claim 4 wherein the integrated circuit comprises an application specific integrated circuit (ASIC).

7. An electric power assisted steering system according to claim 4 wherein a further resistor is provided between the input of the analogue to digital converter and ground, the further resistor causing the current output from the first amplifier to produce a proportional voltage at the input to the analogue to digital converter.

8. An electric power assisted steering system according to claim 4, wherein the motor current measurement circuit is arranged to determine the rate of change of the amount of electrical current.

9. An electric power assisted steering system according to claim 8, in which the motor has a rotor having a varying angular position, and the control circuit is arranged to determine the angular position of the rotor from the rate of change of the amount of the electrical current.

* * * * *